United States Patent
Liu et al.

[11] Patent Number: 6,080,657
[45] Date of Patent: Jun. 27, 2000

[54] METHOD OF REDUCING ALCU HILLOCKS

[75] Inventors: Chung-Shi Liu, Hsin-Chu; Shau-Lin Shue, Hsinchu; Chen-Hua Yu, Hsin-Chu, all of Taiwan

[73] Assignee: Taiwan Semiconductor Manufacturing Company, Hsin-Chu, Taiwan

[21] Appl. No.: 09/356,008

[22] Filed: Jul. 16, 1999

[51] Int. Cl.[7] .................................................. H01L 21/28
[52] U.S. Cl. .......................... 438/627; 438/629; 438/643; 438/653; 438/688
[58] Field of Search .................................. 438/627, 628, 438/643, 644, 648, 653, 654, 656, 688, 687, 629, 636; 257/751, 764, 765, 771

[56] References Cited

U.S. PATENT DOCUMENTS

| | | | |
|---|---|---|---|
| 4,782,380 | 11/1988 | Shankar et al. | 357/71 |
| 5,071,791 | 12/1991 | Inoue et al. | 437/203 |
| 5,312,772 | 5/1994 | Yokoyama et al. | 438/649 |
| 5,356,836 | 10/1994 | Chen et al. | 437/194 |
| 5,371,042 | 12/1994 | Ong | 437/194 |
| 5,449,640 | 9/1995 | Hunt et al. | 437/190 |
| 5,514,908 | 5/1996 | Liao et al. | 257/751 |
| 5,567,987 | 10/1996 | Lee | 257/751 |
| 5,736,458 | 4/1998 | Teng | 438/627 |
| 5,943,601 | 8/1999 | Usui et al. | 438/688 |
| 5,972,786 | 10/1999 | Hoshino et al. | 437/627 |

OTHER PUBLICATIONS

Yoo, B., et al., "Ionized Metal Plasma Deposition of Titanium . . . " Interconnect Technology Conference Proceedings, IEEE Jun. 1–3, 1998, pp. 262–264.

Hashimoto, K., et al., "Electromigration Characteristics of High Temperature Sputtered Al–Alloy Metallization," IEEE International Reliability Physics Symposium, Apr. 11–14, 1994, pp. 185–191.

Wolf, "Silicon Processing for the VLSI Era", vol. 2: Process Integration, Lattice Press, Sunset Beach, CA, (1990), pp. 268–273.

*Primary Examiner*—T. N. Quach
*Attorney, Agent, or Firm*—George O. Saile; Stephen B. Ackerman; Rosemary L.S. Pike

[57] ABSTRACT

A method of aluminum metallization in the manufacture of an integrated circuit device is described. An insulating layer is provided over the surface of a semiconductor substrate wherein a metal plug fills an opening through the insulating layer to the semiconductor substrate. A titanium layer is deposited over the surface of the insulating layer and the metal plug using ionized metal plasma. A titanium nitride is deposited layer overlying the titanium layer. Vacuum is broken and the titanium nitride layer is exposed to the ambient air whereby a titanium oxynitride layer forms on the surface of titanium nitride layer. An aluminum layer is sputter deposited over the titanium oxynitride layer at a high temperature of greater than about 400 ° C. and low power of less than or equal to 4 kilowatts. The aluminum layer will be deposited in a (111)-orientation. The metal stack is patterned to form a metal line. Hillocks and metal voids are prevented by the process of the invention.

23 Claims, 3 Drawing Sheets

METHOD OF REDUCING ALCU HILLOCKS

BACKGROUND OF THE INVENTION

(1) Field of the Invention

The invention relates to a method of metallization of an integrated circuit device, and more particularly, to an aluminum metallization method using high temperature and low power to avoid hillocks and voids in the manufacture of an integrated circuit device.

(2) Description of the Prior Art

In the fabrication of integrated circuit devices, metal layers make contact to lower conductive layers of the integrated circuit through vias in an insulating layer. Often, tungsten plugs fill the vias. The tungsten plugs are formed by depositing tungsten overlying the insulating layer and within the via openings. The tungsten overlying the insulating layer is removed by etchback or chemical mechanical polishing (CMP), for example. Next, an aluminum or an aluminum alloy is deposited over the tungsten plug and patterned to form the interconnection. Usually, the aluminum or aluminum alloy is part of a metal stack, including TiN/AlCu/TiN, Ti/TiN/AlCu/TiN, TiN/Ti/AlCu/TiN, and TiN/AlCu/Ti/TiN, for example.

The aluminum stack pattern is then covered with an intermetal dielectric layer. This dielectric layer often includes a spin-on layer, such as non-organic spin-on-glass, low-k hydrogen silsesquioxane (HSQ), or organic flare (fluorinated poly (arylene ethers)). A furnace curing is necessary for these spin-on layers. This will lead to increased thermal stress on the metal film, causing metal voids and hillocks. The combined thermal cycling will produce thermal expansion and contraction in cooling. Because the metal has a higher thermal expansion coefficient than the intermetal dielectric (IMD), voids and hillocks randomly form within the metal line to release the stress. Hillocks are spike-like projections that protrude from the surface of the aluminum film. They can cause shorting if they penetrate the dielectric layer between neighboring metal lines. Hillock formation and prevention is discussed in *Silicon Processing for the VLSI Era*, Vol. II, by Stanley Wolf, Lattice Press, Sunset Beach, Calif., c. 1990, pp. 268–273.

Various methods have been proposed to improve aluminum via filling, including hillock and void prevention. U.S. Pat. No. 5,356,836 to Chen et al and U.S. Pat No. 5,371,042 to Ong teach deposition of aluminum in stages at different temperatures. U.S. Pat. No. 5,071,791 to Inoue et al teaches heating the wafer while depositing the aluminum. U.S. Pat. No. 4,782,380 to Shankar et al, U.S. Pat. No. 5,736,458 to Teng, and U.S. Pat. No. 5,449,640 to Hunt et al disclose exposing an underlayer of titanium or titanium nitride to air to stuff the grain boundaries with oxide. None of these patents discusses the problem of hillock and void prevention in an aluminum layer over a tungsten plug.

SUMMARY OF THE INVENTION

Accordingly, it is a principal object of the present invention to provide an effective and very manufacturable method of metallization which prevents the formation of hillocks in the manufacture of an integrated circuit device.

Another object of the invention is to provide a method of aluminum metallization which prevents the formation of hillocks in the manufacture of an integrated circuit device.

Yet another object of the present invention is to provide a method of aluminum metallization over a metal plug which prevents the formation of hillocks in the manufacture of an integrated circuit device.

A further object of the present invention is to provide a method of aluminum metallization over a metal plug which prevents the formation of voids.

In accordance with the objects of this invention a new method of aluminum metallization in the manufacture of an integrated circuit device is achieved. An insulating layer is provided over the surface of a semiconductor substrate wherein a metal plug fills an opening through the insulating layer to the semiconductor substrate. A titanium layer is deposited over the surface of the insulating layer and the metal plug using ionized metal plasma. A titanium nitride layer is deposited overlying the titanium layer. Vacuum is broken and the titanium nitride layer is exposed to the ambient air whereby a titanium oxynitride layer forms on the surface of titanium nitride layer. An aluminum layer is sputter deposited over the titanium oxynitride layer at a high temperature of greater than about 400° C. and low power of less than or equal to 4 kilowatts. The aluminum layer will be deposited in a (111)-orientation. The metal stack is patterned to form a metal line. Hillocks and metal voids are prevented by the process of the invention.

BRIEF DESCRIPTION OF THE DRAWINGS

In the accompanying drawings forming a material part of this description, there is shown.

DESCRIPTION OF THE PREFERRED EMBODIMENTS

The aluminum metallization process of the present invention can be used at any level of metallization as an interconnection between an underlying metal plug, such as tungsten, and an overlying metal line.

Figure 1:
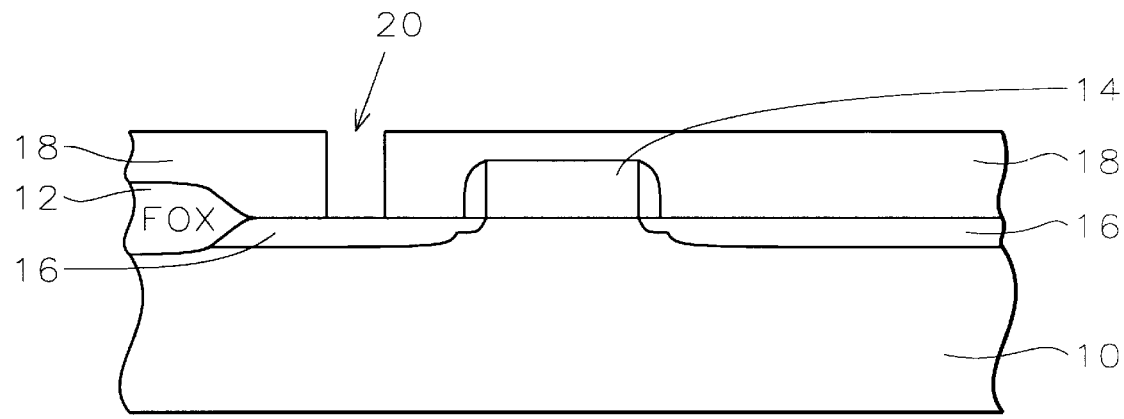
FIGS. 1 through 6 schematically illustrate in cross-sectional representation a preferred embodiment of the present invention.

Referring now to FIG. 1, there is shown a portion of a partially completed integrated circuit device. The semiconductor substrate 10 is preferably composed of monocrystalline silicon. Isolation regions may be formed to separate active regions from one another. Isolation regions may comprise local oxidation of silicon (LOCOS) or shallow trench isolation (STI), or the like. In the example shown, a Field OXide region 12 has been formed in and on the semiconductor substrate.

Semiconductor device structures have been formed in and on the semiconductor substrate, including gate electrode 14 and source and drain regions 16. An insulating layer 18, typically composed of silicon dioxide, tetraethoxysilane (TEOS) oxide, borophosphosilicate glass (BPSG), or the like, is deposited over the semiconductor device structures to a thickness of between about 4000 to 10,000 Angstroms. Using conventional lithography and etching techniques, contact openings 20 are formed through the insulating layer 18 to the semiconductor device structures to be contacted, such as source and drain regions 16, as illustrated in FIG. 1.

Figure 2:
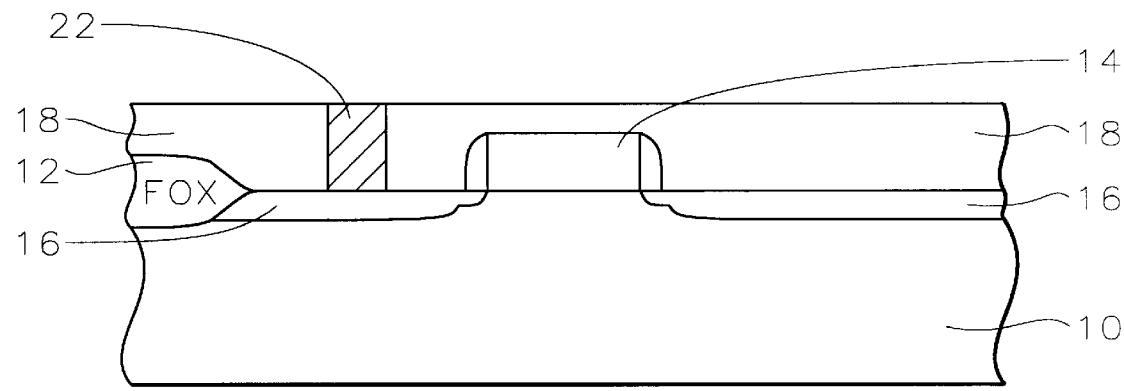

The contact opening is filled with a metal layer, such as tungsten, which is etched back or polished away, such as by CMP, to leave tungsten plug 22, as shown in FIG. 2. Typically, a barrier metal layer such as Ti/TiN, not shown, is deposited into the contact opening before the tungsten layer is deposited.

Now, the key features of the present invention to prevent hillock and void formation in an aluminum line stack will be described. It is desired to form an aluminum line of (111)-textured AlCu. AlCu having a (111) preferred orientation is known to have better electromigration resistance than an aluminum line having a random orientation. In their paper, "Novel (111)-Textured AlCu Growth by the Use of Ionized Metal Plasma (IMP) Titanium as Underlayer," by C. S. Liu et al, Jun. 16–18 1998 VMIC Conference, pp. 378–380, the authors discuss the growth of (111)-textured AlCu.

Figure 3:
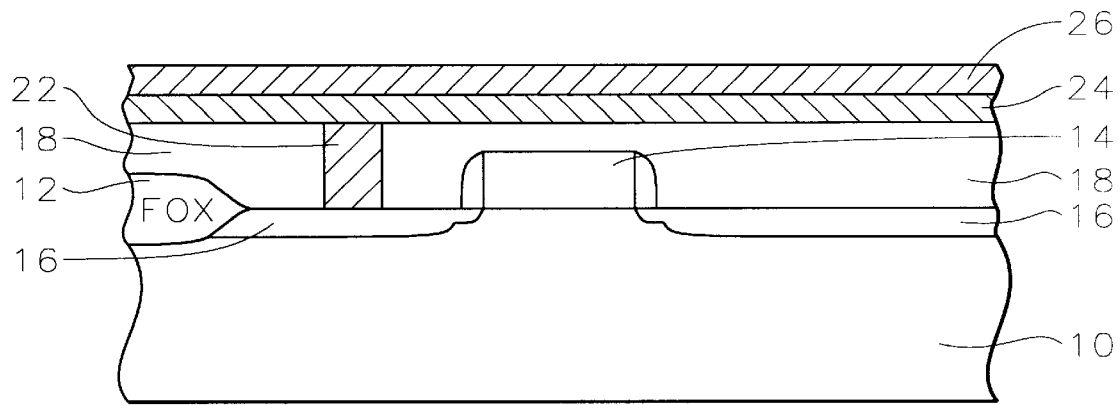

In the process of the invention, a barrier layer is formed. Referring now to FIG. 3, a layer of titanium 24 is deposited over the surface of the dielectric layer 18 and the metal plug 22 to a thickness of between about 100 and 200 Angstroms. The titanium layer is deposited by ionized metal plasma (IMP). IMP uses an inductive coupling method to induce current in the plasma. In a standard physical vapor deposition (PVD) chamber, a plasma is maintained in a small area around the target where secondary electrons are trapped. Inductive coupling is used in the IMP method to create a plasma of sufficient density to ionize the titanium atoms and fill the entire volume of the chamber inside the shields. By controlling the potential differences of the wafer and plasma, the titanium film can be deposited in a more vertical direction resulting in a (002)-oriented titanium film.

Next, a layer of titanium nitride 26 is deposited over the titanium layer 22 to a thickness of between about 250 to 500 Angstroms. Since the titanium layer 22 is (002)-oriented, the overlying titanium nitride layer will be (111) dominant. This completes the barrier layer.

Figure 4:
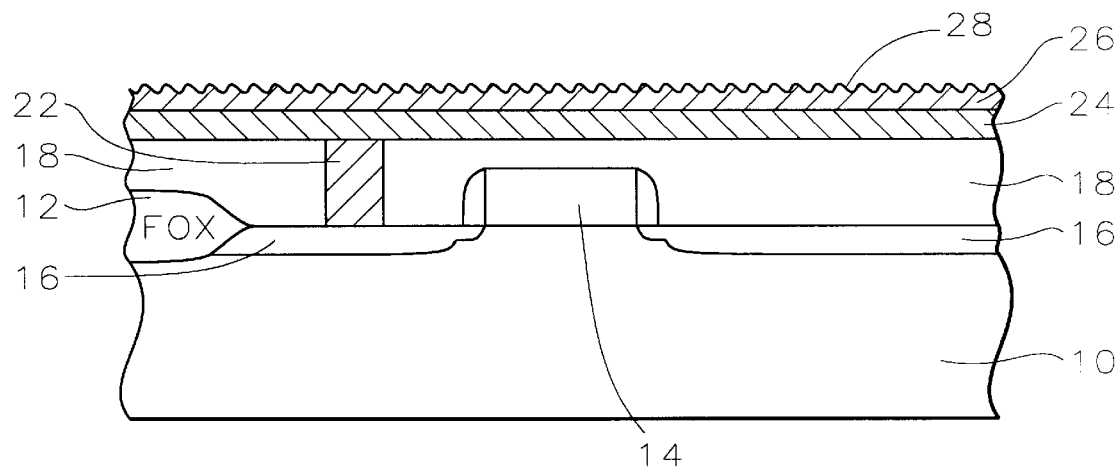

Vacuum is broken at this point and the substrate is exposed to the ambient air. The vacuum break prevents the subsequently deposited aluminum from reacting with the titanium layer 22. Exposing the titanium nitride layer to ambient air stuffs the grain boundaries of the titanium nitride film with oxygen. This will prevent the subsequently deposited AlCu film from diffusing along the TiN grain boundaries to react with the underlying titanium layer during thermal processing. It will also prevent the silicon from beneath from migrating upward through the barrier layer. The wavy line 28 at the upper edge of the titanium nitride layer 26 in FIG. 4 indicates the presence of the thin layer of titanium oxynitride which forms on the titanium nitride upon exposure to the ambient air.

Figure 5:
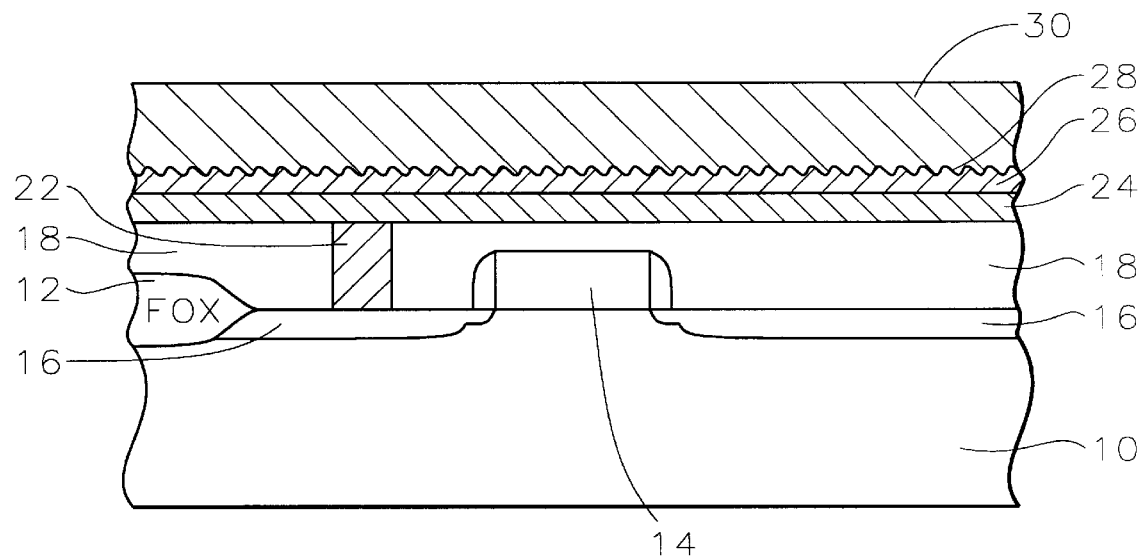

Referring now to FIG. 5, the aluminum layer 30 is sputter deposited over the barrier metal layer 24/26/28 to a thickness of between about 4000 and 10,000 Angstroms. This layer 30 may be aluminum or preferably an aluminum alloy, such as AlCu or AlSiCu. Conventionally, the aluminum is deposited at a temperature of about 300° C. at a power of about 12 kW. However, in the process of the present invention, the aluminum is deposited at a high temperature of more than about 400° C. and preferably 380 to 420° C. at a low power of less than or equal to 4 kW. The high temperature low power deposition increases deposition time thereby allowing more time for the aluminum layer to release stress. The conventional deposition time is about 245 seconds. The invention's deposition time is about 725 seconds.

The aluminum layer 30 is (111)-textured. Usually, AlCu deposited on titanium nitride forms in a random orientation. Using the IMP-sputtered titanium underlayer of the invention causes the titanium nitride to form in a (111)-orientation and hence, the overlying AlCu layer will be (111)-oriented as well. This (111)-textured AlCU has less of a grain boundary distribution resulting in better electromigration resistance.

Figure 6:
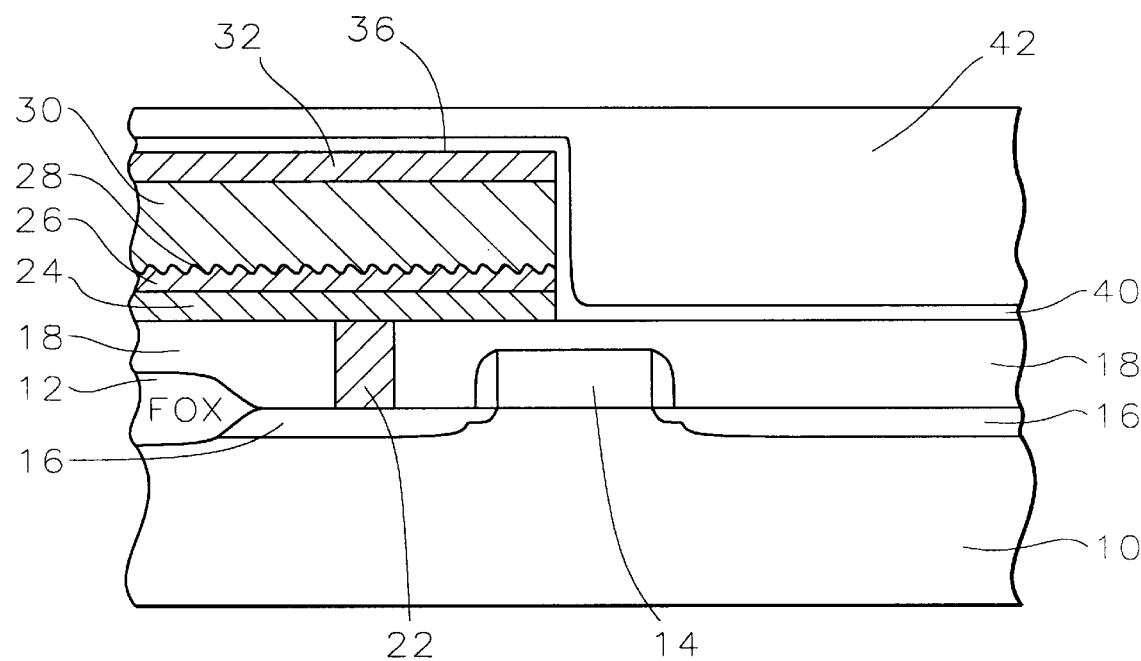

Now, referring to FIG. 6, an anti-reflective coating layer 32, such as titanium nitride, is deposited over the aluminum layer 30. The aluminum stack is patterned as desired to form metal lines 36.

Processing continues as is conventional in the art to form the intermetal dielectric layer. Typically, this is a sandwich layer, such as a first layer of silicon dioxide, a second layer of spin-on-glass, and a third layer of silicon dioxide. For example, first silicon dioxide layer 40 and second spin-on-glass layer 42 are illustrated. During curing of the spin-on-glass layer at high temperatures, hillocks and voids would form in the aluminum layer 30 in the prior art.

However, the process of the present invention prevents the formation of voids and hillocks. Voids and hillocks form during stress migration and electromigration. In the process of the invention, the aluminum is formed with a (111)-orientation which has been found to suppress void formation. The use of ionized metal plasma to form the titanium underlayer causes the overlying AlCu layer to be formed in the desired (111) orientation. The presence of the titanium nitride layer underlying the AlCu layer prevents the reaction of the AlCU with the underlying titanium film. By breaking vacuum before AlCu deposition, the titanium nitride grain boundaries are stuffed with oxygen to prevent diffusion of the underlying silicon or the overlying AlCu through the grain boundaries. It is generally accepted that grain-boundary diffusion is the primary mechanism of electromigration failure. Additionally, the high temperature low power AlCu deposition reduces the stress of the AlCu itself.

The metallization process of the present invention can be used for all levels of metallization and results in the prevention of voids and hillocks in the aluminum layer.

While the invention has been particularly shown and described with reference to the preferred embodiments thereof, it will be understood by those skilled in the art that various changes in form and details may be made without departing from the spirit and scope of the invention.

What is claimed is:

1. A method of metallization in the fabrication of an integrated circuit device comprising:

providing an insulating layer over the surface of a semiconductor substrate wherein a metal plug fills an opening through said insulating layer to said semiconductor substrate;

depositing a titanium layer over the surface of said insulating layer and said metal plug;

depositing a titanium nitride layer overlying said titanium layer;

exposing said titanium nitride layer to the ambient air whereby a titanium oxynitride layer forms on the surface of said titanium nitride layer; and sputter depositing an aluminum layer over said titanium oxynitride layer at a high temperature of greater than 380° C. completing said metallization in the fabrication of said integrated circuit device.

2. The method according to claim 1 wherein said metal plug comprises tungsten.

3. The method according to claim 1 wherein said titanium layer is deposited by ionized metal plasma to a thickness of between about 100 and 200 Angstroms.

4. The method according to claim 1 wherein said titanium nitride layer is deposited to a thickness of between about 200 and 500 Angstroms.

5. The method according to claim 1 wherein said step of depositing said aluminum layer is performed at a low power of less than or equal to 4 kilowatts.

6. The method according to claim 1 further comprising:

depositing an anti-reflective coating layer overlying said aluminum layer;

patterning said anti-reflective coating layer, said aluminum layer, said titanium oxynitride layer, said titanium nitride layer, and said titanium layer to form a metal line contacting said metal plug; and depositing an intermetal dielectric layer over said metal line wherein subsequent thermal cycles do not cause hillock formation in said metal line.

7. The method according to claim 1 wherein said insulating layer is an oxide layer.

8. The method according to claim 1 wherein said aluminum layer comprises AlCu.

9. The method according to claim 1 wherein said aluminum layer comprises (111)-textured AlCu.

10. A method of metallization in the fabrication of an integrated circuit device comprising:

providing an insulating layer over the surface of a semiconductor substrate wherein a metal plug fills an opening through said insulating layer to said semiconductor substrate;

depositing a titanium layer over the surface of said insulating layer and said metal plug wherein said deposition comprises ionized metal plasma;

depositing a titanium nitride layer overlying said titanium layer;

exposing said titanium nitride layer to the ambient air whereby a titanium oxynitride layer forms on the surface of said titanium nitride layer; and sputter depositing an aluminum layer over said titanium oxynitride layer at a high temperature of greater than 380° C. completing said metallization in the fabrication of said integrated circuit device.

11. The method according to claim 10 wherein said metal plug comprises tungsten.

12. The method according to claim 10 wherein said titanium layer has a thickness of between about 100 and 200 Angstroms.

13. The method according to claim 10 wherein said titanium nitride layer is deposited to a thickness of between about 200 and 500 Angstroms.

14. The method according to claim 10 wherein said step of depositing said aluminum layer is performed at a low power of less than or equal to 4 kilowatts.

15. The method according to claim 10 further comprising:

depositing an anti-reflective coating layer overlying said aluminum layer;

patterning said anti-reflective coating layer, said aluminum layer, said titanium oxynitride layer, said titanium nitride layer, and said titanium layer to form a metal line contacting said metal plug; and depositing an intermetal dielectric layer over said metal line wherein subsequent thermal cycles do not cause hillock formation in said metal line.

16. The method according to claim 10 wherein said insulating layer is an oxide layer.

17. The method according to claim 10 wherein said aluminum layer comprises (111)-textured AlCu.

18. A method of metallization in the fabrication of an integrated circuit device comprising:

providing an insulating layer over the surface of a semiconductor substrate wherein a metal plug fills an opening through said insulating layer to said semiconductor substrate;

depositing a titanium layer over the surface of said insulating layer and said metal plug wherein said deposition comprises ionized metal plasma;

depositing a titanium nitride layer overlying said titanium layer;

breaking vacuum and exposing said titanium nitride layer to the ambient air whereby a titanium oxynitride layer forms on the surface of said titanium nitride layer; and sputter depositing a (111)-textured aluminum layer over said titanium oxynitride layer at a high temperature of greater than 380° C. and low power of less than or equal to 4 kilowatts completing said metallization in the fabrication of said integrated circuit device.

19. The method according to claim 18 wherein said metal plug comprises tungsten.

20. The method according to claim 18 wherein said titanium layer has a thickness of between about 100 and 200 Angstroms.

21. The method according to claim 18 wherein said titanium nitride layer is deposited to a thickness of between about 200 and 500 Angstroms.

22. The method according to claim 18 further comprising:

depositing an anti-reflective coating layer overlying said aluminum layer;

patterning said anti-reflective coating layer, said aluminum layer, said titanium oxynitride layer, said titanium nitride layer, and said titanium layer to form a metal line contacting said metal plug; and depositing an intermetal dielectric layer over said metal line wherein subsequent thermal cycles do not cause hillock formation in said metal line.

23. The method according to claim 18 wherein said aluminum layer comprises AlCu.

* * * * *